United States Patent
Igarashi (10) Patent No.: US 11,404,456 B2
(45) Date of Patent: Aug. 2, 2022

(54) PHOTOELECTRIC CONVERSION DEVICE

(71) Applicant: CANON KABUSHIKI KAISHA, Tokyo (JP)

(72) Inventor: Kazuya Igarashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/728,331

(22) Filed: Dec. 27, 2019

(65) Prior Publication Data
US 2020/0219916 A1 Jul. 9, 2020

(30) Foreign Application Priority Data
Jan. 8, 2019 (JP) .............................. JP2019-001145

(51) Int. Cl.
H01L 27/146 (2006.01)
G05D 1/02 (2020.01)
H04N 5/3745 (2011.01)

(52) U.S. Cl.
CPC ..... *H01L 27/14605* (2013.01); *G05D 1/0246* (2013.01); *H01L 27/14612* (2013.01); *H01L 27/14627* (2013.01); *H01L 27/14636* (2013.01); *H04N 5/3745* (2013.01); *G05D 2201/0213* (2013.01); *H01L 27/14641* (2013.01)

(58) Field of Classification Search
CPC ......... H01L 27/14605; H01L 27/14627; H01L 27/14636; H01L 27/14641; H01L 27/1463; H01L 27/14612; H04N 5/3696; H04N 5/3745; G05D 1/0246; G05D 2201/0213
See application file for complete search history.

(56) References Cited

U.S. PATENT DOCUMENTS

| | | | | |
|---|---|---|---|---|
| 5,166,799 A | * | 11/1992 | Hasegawa | H04N 5/3765 348/320 |
| 5,251,069 A | * | 10/1993 | Iizuka | G02B 13/18 359/717 |
| 5,400,072 A | * | 3/1995 | Izumi | H04N 5/2253 348/335 |
| 5,652,664 A | * | 7/1997 | Kusaka | G02B 7/346 348/323 |
| 5,801,373 A | * | 9/1998 | Oozu | H04N 5/3742 348/E3.027 |
| 6,590,239 B2 | * | 7/2003 | Hsiung | H01L 27/14627 257/233 |

(Continued)

FOREIGN PATENT DOCUMENTS

| | | |
|---|---|---|
| JP | 2010-258036 A | 11/2010 |
| JP | 2013-055247 A | 3/2013 |

(Continued)

*Primary Examiner* — Philip P. Dang
(74) *Attorney, Agent, or Firm* — Venable LLP (57) ABSTRACT

A photoelectric conversion device includes a pixel area, the pixel area including a plurality of pixels arranged in a matrix, each pixel comprising a photoelectric conversion portion, a floating diffusion, and a transfer gate, the transfer gate controlling transfer of charges generated in the photoelectric conversion portion to the floating diffusion. The photoelectric conversion portion is shifted relatively to the transfer gate depending on a position thereof in the pixel area. The shifting direction is a direction perpendicular to a charge transfer direction from the photoelectric conversion portion to the floating diffusion.

21 Claims, 11 Drawing Sheets

(56) References Cited

U.S. PATENT DOCUMENTS

| | | | | |
|---|---|---|---|---|
| 6,717,190 B2* | 4/2004 | Shizukuishi | H01L 27/14843 | 257/E27.152 |
| 6,965,463 B1* | 11/2005 | Moritaku | H04N 1/58 | 348/262 |
| 7,030,918 B1* | 4/2006 | Nakashiba | H01L 27/14621 | 348/294 |
| 7,218,348 B2* | 5/2007 | Misawa | H04N 9/0451 | 348/E9.01 |
| 7,288,429 B2* | 10/2007 | Yaung | H01L 27/14643 | 257/292 |
| 7,400,023 B2* | 7/2008 | Watanabe | H01L 27/14692 | 257/E31.124 |
| 7,537,951 B2* | 5/2009 | Gambino | H01L 27/14687 | 438/48 |
| 7,579,665 B2* | 8/2009 | Yokoyama | H01L 27/14621 | 257/443 |
| 7,605,415 B2* | 10/2009 | Koizumi | H01L 27/14609 | 257/292 |
| 7,667,750 B2* | 2/2010 | Goto | H01L 27/14647 | 348/308 |
| 7,760,254 B2* | 7/2010 | Suzuki | H01L 27/14647 | 348/277 |
| 7,800,191 B2* | 9/2010 | Ohtsuki | H01L 27/14603 | 257/431 |
| 7,888,763 B2* | 2/2011 | Qian | H01L 27/1464 | 257/E33.068 |
| 8,053,821 B2* | 11/2011 | Moon | G11B 17/228 | 257/292 |
| 8,125,547 B2* | 2/2012 | Oda | H04N 5/37457 | 348/277 |
| 8,148,672 B2* | 4/2012 | Toda | H01L 27/14632 | 250/237 G |
| 8,223,234 B2* | 7/2012 | Inuiya | H01L 27/14629 | 348/294 |
| 8,274,123 B2* | 9/2012 | Tanaka | G02B 3/0056 | 257/435 |
| 8,378,400 B2* | 2/2013 | Masuoka | H01L 31/103 | 257/292 |
| 8,400,689 B2* | 3/2013 | Shiraishi | H04N 5/37213 | 358/509 |
| 8,405,180 B2* | 3/2013 | Akiyama | H01L 27/14643 | 257/E31.127 |
| 8,422,136 B2* | 4/2013 | Hasegawa | B32B 38/0004 | 359/620 |
| 8,445,950 B2* | 5/2013 | Iida | H01L 27/1463 | 257/E31.127 |
| 8,466,452 B2* | 6/2013 | Kim | H01L 51/4273 | 257/432 |
| 8,648,436 B2* | 2/2014 | Toda | H01L 27/14625 | 257/443 |
| 8,681,261 B2* | 3/2014 | Oikawa | H04N 5/37457 | 348/345 |
| 8,754,976 B2* | 6/2014 | Oikawa | H04N 5/232122 | 348/294 |
| 8,759,738 B2* | 6/2014 | Kuboi | H01L 27/1462 | 250/239 |
| 8,773,558 B2* | 7/2014 | Kato | H01L 27/14629 | 257/432 |
| 8,916,917 B2* | 12/2014 | Furuya | H01L 27/14641 | 257/E27.128 |
| 8,947,753 B2* | 2/2015 | Hiranuma | H04N 1/48 | 358/514 |
| 9,054,243 B2* | 6/2015 | Sawayama | H01L 27/14629 | |
| 9,219,175 B2* | 12/2015 | Fukumizu | H01L 27/14689 | |
| 9,293,493 B2* | 3/2016 | Kobayashi | H01L 27/14623 | |
| 9,344,653 B2* | 5/2016 | Shimotsusa | H01L 27/14623 | |
| 9,392,193 B2* | 7/2016 | Suzuki | H04N 5/3696 | |
| 9,425,225 B2* | 8/2016 | Matsunaga | H01L 27/14612 | |
| 9,443,891 B2* | 9/2016 | Numata | H01L 27/1461 | |
| 9,455,302 B2* | 9/2016 | Lee | H01L 27/307 | |
| 9,515,117 B2* | 12/2016 | Kimura | H01L 27/14641 | |
| 9,515,126 B2* | 12/2016 | Lee | H01L 27/14645 | |
| 9,560,380 B2* | 1/2017 | Henry | H04N 19/25 | |
| 9,565,381 B2* | 2/2017 | Numata | H01L 27/14627 | |
| 9,614,010 B2* | 4/2017 | Joei | H04N 5/376 | |
| 9,620,657 B2* | 4/2017 | Lee | G02B 27/1013 | |
| 9,666,628 B2* | 5/2017 | Hayashi | H01L 27/14687 | |
| 9,748,295 B2* | 8/2017 | Lee | H01L 27/14647 | |
| 9,774,774 B2* | 9/2017 | Lee | H04N 5/2254 | |
| 9,853,223 B2* | 12/2017 | Wada | C07D 235/18 | |
| 9,881,960 B2* | 1/2018 | Sato | H01L 27/14665 | |
| 9,923,006 B2* | 3/2018 | Watanabe | H01L 27/14643 | |
| 9,989,677 B2* | 6/2018 | Shalaev | G02B 1/002 | |
| 10,008,544 B2* | 6/2018 | Park | H01L 51/441 | |
| 10,021,328 B2* | 7/2018 | Takada | H04N 5/378 | |
| 10,186,544 B2* | 1/2019 | Lee | H01L 27/1461 | |
| 10,325,947 B2* | 6/2019 | Velichko | H04N 5/3745 | |
| 10,347,841 B2* | 7/2019 | Choi | C09B 57/00 | |
| 10,348,990 B2* | 7/2019 | Gotoh | G01J 3/2823 | |
| 10,396,113 B2* | 8/2019 | Yamaguchi | H01L 27/14625 | |
| 10,436,908 B2* | 10/2019 | Mase | G01S 7/4914 | |
| 10,497,730 B2* | 12/2019 | Kim | H01L 27/14612 | |
| 10,566,557 B2* | 2/2020 | Yamaguchi | H01L 51/4213 | |
| 2006/0063295 A1* | 3/2006 | Kuwazawa | H01L 27/14601 | 438/75 |
| 2007/0020795 A1* | 1/2007 | Mori | H01L 27/1463 | 438/57 |
| 2008/0035835 A1* | 2/2008 | Komatsu | B82Y 10/00 | 250/208.1 |
| 2010/0265372 A1 | 10/2010 | Sato | | |
| 2011/0234875 A1* | 9/2011 | Maeda | H04N 5/37457 | 348/308 |
| 2013/0221410 A1* | 8/2013 | Ahn | H01L 27/1464 | 257/225 |
| 2016/0141323 A1 | 5/2016 | Igarashi et al. | | |
| 2016/0181309 A1* | 6/2016 | Uehira | H01L 27/14627 | 257/432 |
| 2016/0234449 A1 | 8/2016 | Ishiwata | | |
| 2016/0247860 A1* | 8/2016 | Ito | H01L 51/4253 | |
| 2017/0047363 A1* | 2/2017 | Choi | H01L 27/1464 | |
| 2017/0310913 A1* | 10/2017 | Takada | H01L 27/14614 | |
| 2018/0067242 A1* | 3/2018 | Lai | G02B 9/04 | |
| 2018/0184005 A1* | 6/2018 | Morotomi | H04N 5/23251 | |
| 2018/0277604 A1* | 9/2018 | Joei | H01L 51/4273 | |
| 2018/0350864 A1* | 12/2018 | Toyoguchi | H01L 27/14625 | |
| 2020/0260012 A1* | 8/2020 | Tokuse | H04N 5/2253 | |
| 2020/0288076 A1* | 9/2020 | Kozuka | H04N 5/225 | |

FOREIGN PATENT DOCUMENTS

| | | |
|---|---|---|
| JP | 2015-065269 A | 4/2015 |
| WO | 2006/040963 A1 | 4/2006 |

* cited by examiner

PHOTOELECTRIC CONVERSION DEVICE

BACKGROUND OF THE INVENTION

Field of the Invention

The present invention relates to a photoelectric conversion device.

Description of the Related Art

A digital camera has recently been used in a variety of fields. A digital camera is composed of at least an imaging lens and a solid-state imaging device (photoelectric conversion device). The solid-state imaging device has pixels arranged in a matrix in an imaging area surface. In such a solid-state imaging device, a principal ray of incident light is perpendicularly incident on the central portion in the imaging area, whereas the ray is obliquely incident on the peripheral portion of the imaging area. This causes shading in which output from the peripheral pixels is reduced and mixing of colors into adjacent pixels.

WO 2006/040963 proposes a structure in which a microlens is shifted toward the center of the imaging area and, conversely, the photoelectric conversion portion is made shifted toward the periphery of the screen so that light is received efficiently by the photoelectric conversion portion.

Unfortunately, if a photoelectric conversion portion is shifted toward the periphery of the pixel area (imaging area), the relative positional relationship between the photoelectric conversion portion and the transfer gate or the floating diffusion varies with each pixel in the pixel area surface. This may cause problems in some pixels, including transfer failure or insufficient saturated charge amount.

Also, a shift of the transfer gate and the floating diffusion in response to the shift of the photoelectric conversion portion may change the pattern of the contact hole and interconnection connected thereto. It may increase the restriction on the pixel layout, making it difficult to maximize the pixel performance.

SUMMARY OF THE INVENTION

An object of the present invention is to provide a photoelectric conversion device that may uniformly keep the in-plane transfer characteristics from the photoelectric conversion portion to the floating diffusion and the in-plane saturated charge amount, while improving shading and reducing color mixing due to the shift of the photoelectric conversion portion.

An aspect of the disclosure is a photoelectric conversion device comprising a pixel area, the pixel area including a plurality of pixels arranged in a matrix, each pixel comprising a photoelectric conversion portion, a floating diffusion, and a transfer gate, the transfer gate controlling transfer of charges generated in the photoelectric conversion portion to the floating diffusion, wherein the photoelectric conversion portion is shifted relatively to the transfer gate depending on a position thereof in the pixel area, and wherein a shifting direction is a direction perpendicular to a charge transfer direction from the photoelectric conversion portion to the floating diffusion.

The present invention may provide a photoelectric conversion device that may keep the uniform transfer characteristics and saturated charge amount in the pixel area surface, while improving shading and reducing color mixing due to the shift of the photoelectric conversion portion.

Further features of the present invention will become apparent from the following description of exemplary embodiments with reference to the attached drawings.

DESCRIPTION OF THE EMBODIMENTS

Now a configuration of a photoelectric conversion device (solid-state imaging device) according to the present invention is explained with reference to a plurality of embodiments. Each embodiment constitutes a part of the present invention and may be changed as appropriate and thus the present invention is not limited thereto. Alternatively, a plurality of embodiments may also be combined. In addition, in the embodiments explained below, a first conductivity type is P-type and a second conductivity type is N-type. However, if the first conductivity type and the second conductivity type are opposite in polarity, the first conductivity type may be N-type and the second conductivity type may be P-type.

Embodiment 1

Figure 1:
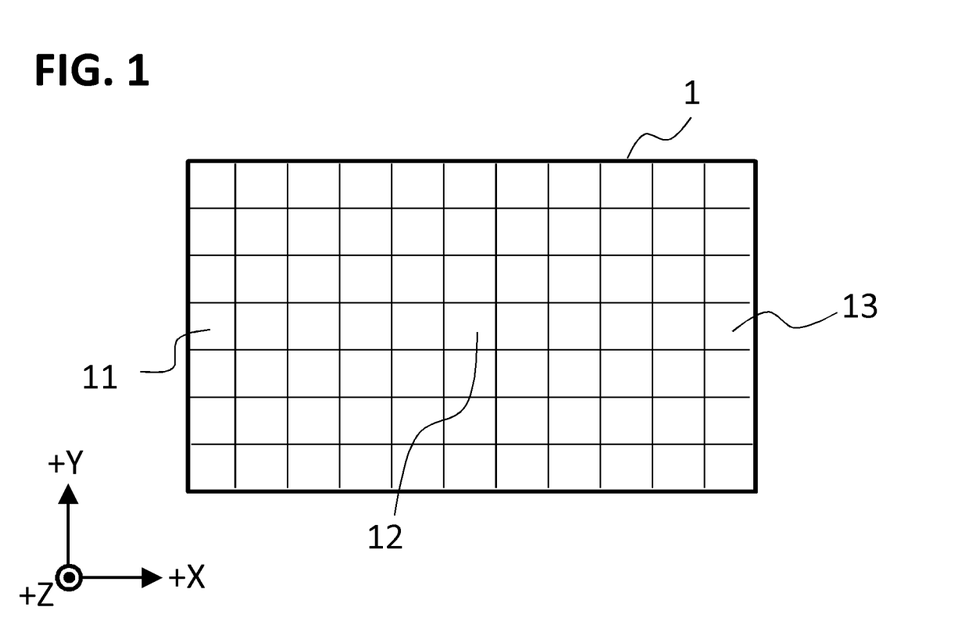
FIG. 1 is a schematic diagram of a pixel area in a solid-state imaging device according to embodiment 1.

FIG. 1 is a plan view of a pixel area (imaging area) 1 including a plurality of pixels arranged in a matrix in a solid-state imaging device according to this embodiment. Although the pixel area 1 actually includes pixels of millions to tens of millions, only some of the pixels are illustrated here for simplification and convenience of explanation. The pixel in the central portion of the pixel area 1 is referred to as a pixel 12. The pixel in the left side peripheral portion is referred to as a pixel 11. The pixel in the right side peripheral portion is referred to as a pixel 13.

Figure 2A:
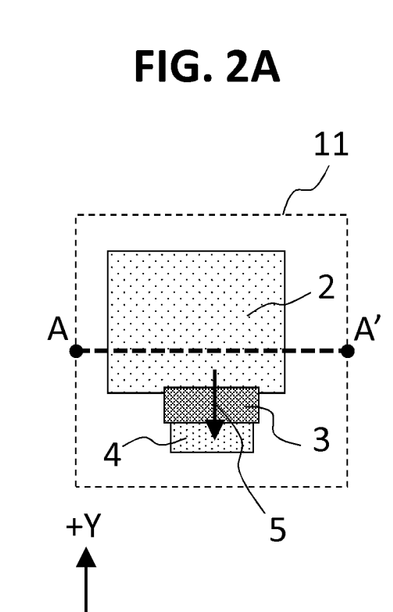
FIGS. 2A to 2C are plan views of pixels constituting the solid-state imaging device according to embodiment 1.
Figure 2B:
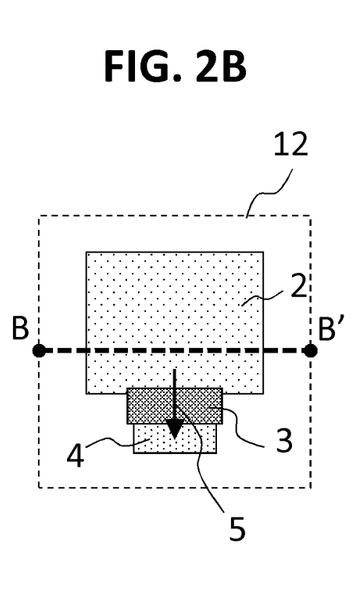
Figure 2C:
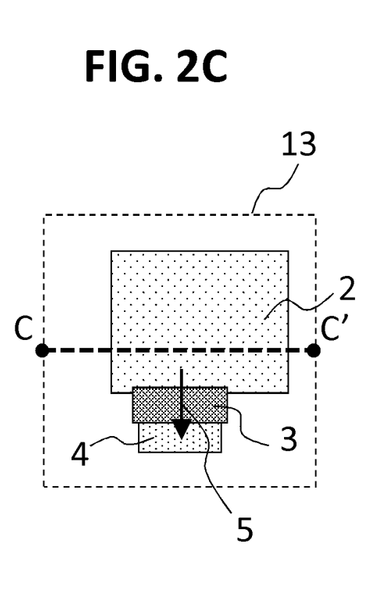

FIGS. 2A to 2C are plan views for illustrating the respective pixel structures. FIG. 2A illustrates the pixel 11, FIG. 2B illustrates the pixel 12, and FIG. 2C illustrates the pixel 13.

Each pixel includes a photoelectric conversion portion 2, a transfer gate 3, and a floating diffusion 4. The transfer gate 3 is the gate of a transfer transistor. In addition, the photoelectric conversion portion 2 is the source of the transfer transistor and the floating diffusion 4 is the drain of the transfer transistor. In this embodiment, an N-type impurity area (a second semiconductor area) formed in a P well (in a first semiconductor area) corresponds to the photoelectric conversion portion 2. In other words, the photoelectric conversion portion 2 in FIGS. 2A to 2C is equivalent to the N-type impurity area.

The photoelectric conversion portion 2 has a function of photoelectrically converting light into charges and accumulating them. The transfer gate 3 has a function of transferring the charges accumulated in the photoelectric conversion portion 2 via an N-type channel formed immediately below the transfer gate 3 to the floating diffusion 4. In this embodiment, the charge transfer direction from the transfer gate 3 to the floating diffusion 4 is the same direction (−Y direction) in all pixels. The floating diffusion 4 has a function of converting the charges transferred from the photoelectric conversion portion 2 into a voltage so that the charges may be read as electrical signals.

Comparing the pixel 11, the pixel 12, and the pixel 13, the position of the photoelectric conversion portion 2 with respect to the transfer gate 3 is different. Specifically, the photoelectric conversion portion 2 is shifted relatively to the transfer gate 3 in each pixel by an amount depending on the pixel position in the pixel area. The shift is in a direction parallel to the X-axis direction perpendicular to the charge transfer direction 5. More specifically, the shift is in a direction toward the periphery of the pixel area. For example, in the pixel 11, the relative position of the photoelectric conversion portion 2 with respect to the transfer gate 3 is shifted to the −X direction compared to the pixel 12. Also, in the pixel 13, the relative position of the photoelectric conversion portion 2 with respect to the transfer gate 3 is shifted to the +X direction compared to the pixel 12. Meanwhile, the transfer gate 3 and the floating diffusion 4 are not shifted. In addition, the photoelectric conversion portion 2 is not shifted in the Y direction. In other words, the relative positional relationship between the photoelectric conversion portion 2, the transfer gate 3, and the floating diffusion 4 in the Y direction is the same in all pixels.

In this embodiment, the positions of the transfer gate 3 and the floating diffusion 4 are the same in each pixel. And although the Y-direction position of the photoelectric conversion portion 2 in each pixel is the same in all pixels, the X-direction position of the photoelectric conversion portion 2 is different depending on the pixel.

Note that the arrangement of the transfer gate 3 and the floating diffusion 4 in the pixel may be different for each pixel. Again, as described above, of the relative positions of the photoelectric conversion portion 2 with respect to the transfer gate 3 and the floating diffusion 4, the X-direction position is different depending on the pixel and the Y-direction position is the same in all pixels.

Figure 3:
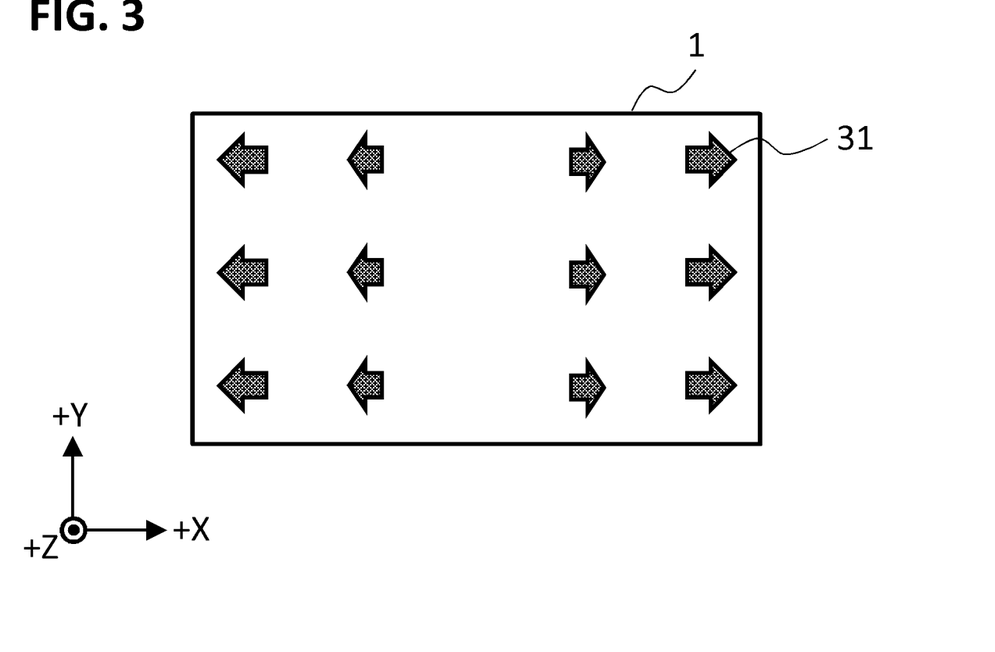
FIG. 3 is a view showing a shift amount and direction of the photoelectric conversion portion according to embodiment 1.
Figure 4:
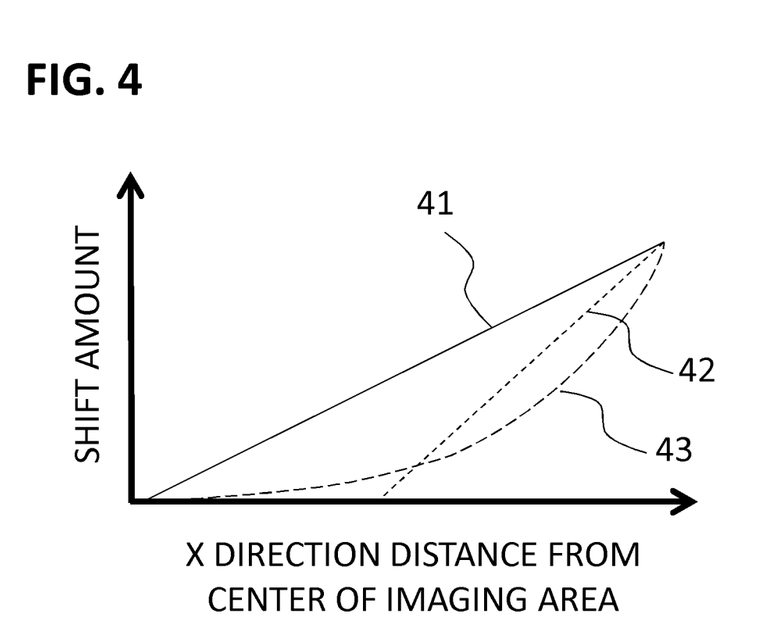
FIG. 4 is a view showing a shift amount of the photoelectric conversion portion according to embodiment 1.

FIG. 3 is a view schematically showing a shift direction and a shift amount of the photoelectric conversion portion 2 in the pixel area in this embodiment. FIG. 4 is a view showing a shift amount of the photoelectric conversion portion 2 in more detail. The shift amount of the photoelectric conversion portion 2 depends on the X-direction distance (absolute value) from the center of the pixel area. Therefore, the shifting amount of the photoelectric conversion portion 2 becomes larger as closer to the peripheral pixels in the row direction, as shown by the shift 31 of the photoelectric conversion portion 2 in FIG. 3. Meanwhile, the shifting amount 31 of the photoelectric conversion portion 2 is the same amount in the pixels disposed in the same column. In this embodiment, the shift amount increases linearly in proportion to the X-direction distance from the central column in the pixel area, as shown by the straight line 41 in FIG. 4. However, the relationship between the X-direction distance and the shift amount is not limited to the linear change and may be any monotonically increasing change in a broad sense. In other words, it is acceptable as long as the shift amount becomes larger in a pixel farther from the central column in the pixel area 1. For example, the shift amount may increase linearly at a certain X-direction distance as shown by the straight line 42, or the shift amount may be changed nonlinearly as shown by the curve 43.

Although not shown in FIGS. 2A to 2C, each pixel also includes a reset transistor, an amplification transistor, and a row select transistor in addition to the transfer gate 3. Although these transistors are usually disposed in the boundary portion with the adjacent pixels, they are preferably disposed avoiding an area between the N-type impurity areas in the X direction so that the shiftable range of the photoelectric conversion portion 2 may be extended. In other words, it is preferable not to dispose the transistors in an area between the photoelectric conversion portions 2 in the pixels adjacent in the X direction.

Figure 5A:
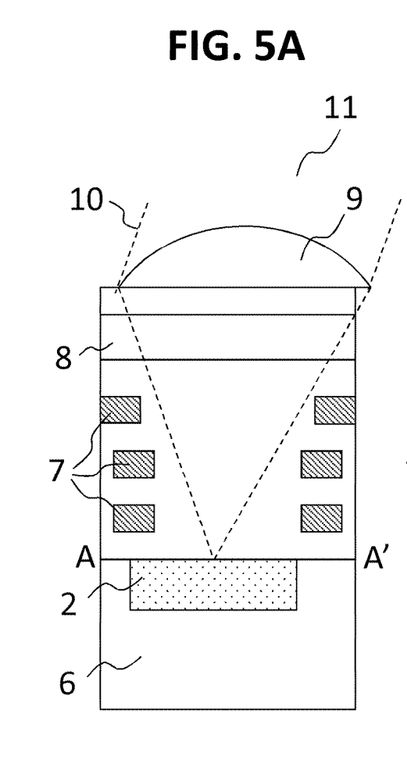
FIGS. 5A to 5C are cross-sectional views of pixels constituting the solid-state imaging device according to embodiment 1.
Figure 5B:
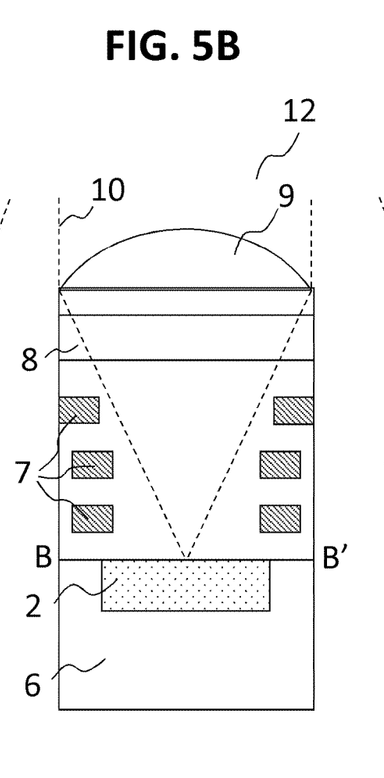
Figure 5C:
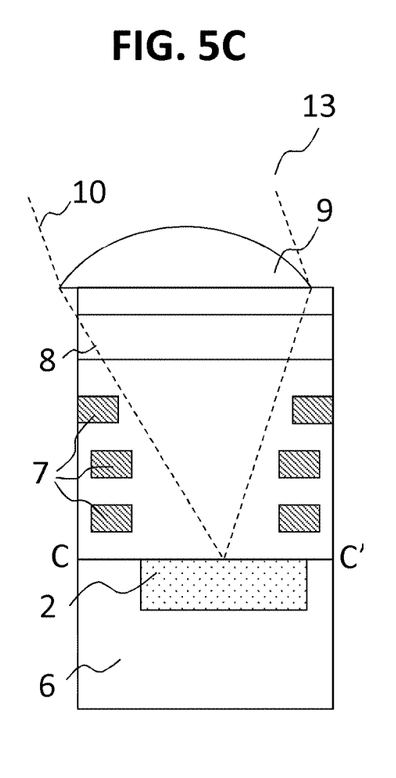

FIGS. 5A to 5C are X-direction cross-sectional views along the pixel center lines A-A', B-B', and C-C' in the pixels 11 to 13 as shown in FIGS. 2A to 2C. Each pixel includes a semiconductor substrate 6 in which the photoelectric conversion portion 2 is formed. Each pixel also includes an interconnection layer 7, a color filter 8, and a microlens 9 that are disposed over the photoelectric conversion portion. The interconnection layer 7 is provided with an opening to allow light to be incident on the photoelectric conversion portion 2. The color filter 8 separates colors. The microlens 9 has a function of collecting incident light.

Light is incident on the pixel 12 at the center of the pixel area in the perpendicular direction (−Z direction), whereas light is incident on the pixels 11 and 13 in the periphery of the pixel area in an oblique direction from the center toward the periphery of the pixel area. Therefore, the microlens 9 is shifted toward the center of the pixel area to prevent light from hitting the interconnection layer 7. The shifting direction of the microlens 9 spreads radially toward the center of the pixel area. The shift amount of the microlens 9 is increased in proportion to the distance from the center of the pixel area.

However, if the microlens 9 is made shifted to minimize light reflection and absorption by the interconnection layer 7 as shown in FIGS. 5A and 5C, the spot (light collection position) made by incident light in the surface of the photoelectric conversion portion 2 shifts from the pixel center toward the periphery of the pixel area. Thus, in this embodiment, each of the photoelectric conversion portions 2 in the pixels 11 and 13 are shifted toward the periphery of the pixel area.

As explained above, the photoelectric conversion portion 2 may receive incident light 10 more efficiently in the peripheral portion of the pixel area by shifting the photoelectric conversion portion 2 as described above. Therefore, it may be possible to limit the brightness reduction (brightness shading) in the peripheral portion and mixing of colors into the adjacent pixels, allowing for improved image quality.

In this embodiment, the photoelectric conversion portion 2 shifts only in the X direction, and the photoelectric conversion portion 2 does not shift in the charge transfer direction 5 (Y direction) from the photoelectric conversion portion 2 to the floating diffusion 4. In other words, the relative positional relationship between the photoelectric conversion portion 2, the transfer gate 3, and the floating diffusion 4 in the Y direction are the same in all pixels included in the pixel area.

Now the effect that would happen if the photoelectric conversion portion 2 is also shifted in the Y-axis direction is explained. If the photoelectric conversion portion 2 is shifted in the +Y direction, that is, in a direction away from the transfer gate 3 and the floating diffusion 4, a potential barrier would arise between the N-type impurity area forming the photoelectric conversion portion 2 and the N-type channel formed immediately below the transfer gate 3. As a result, the charges accumulated in the photoelectric conversion portion 2 would be prevented by the potential barrier from being transferred to the floating diffusion 4, resulting in transfer failure, so-called black flaw.

Conversely, if the photoelectric conversion portion 2 shifts in the −Y direction, that is, in a direction in which the photoelectric conversion portion 2 approaches the transfer gate 3 and the floating diffusion 4, the potential barrier would decrease between the N-type impurity area forming the photoelectric conversion portion 2 and the floating diffusion 4. This may decrease the saturated charge amount that may be accumulated in the photoelectric conversion portion. For the above reasons, a Y-direction shift of the photoelectric conversion portion would cause a significant adverse effect.

Meanwhile, an X-direction shift will not generate the above adverse effect because no change will occur in the potential distribution around the transfer gate 3. Further, as shown in FIGS. 5A to 5C, the photoelectric conversion portion 2 is only shifted depending on its position in the pixel area and keeps its cross-sectional shape and size unchanged. More particularly, in the cross-section through the center of the photoelectric conversion portion 2 in the X direction, the cross-sectional shape of the photoelectric conversion portion 2 is uniform in each pixel in the pixel area. This may thus limit the risk of affecting the charge transfer characteristics and saturated charge amount of the photoelectric conversion portion 2.

For the above reasons, in this embodiment, the photoelectric conversion portion 2 is not shifted in the Y direction, and only shifted in the X direction.

In this embodiment, the charge transfer direction 5 is the Y direction and the shift direction of the photoelectric conversion portion is the X direction. They are, however, not limited to those directions and the charge transfer direction may be set as the X direction and the shift direction of the photoelectric conversion portion may be set as the Y direction. Note, however, that more effect will be exerted as a measure against the brightness shading and color mixing, if the long side direction, in which the distance from the center of the pixel area is long and the angle of incident light becomes large, of the pixel area is the shift direction of the photoelectric conversion portion, and the charge transfer direction is the short side direction, as in this embodiment.

The solid-state imaging device in the above configuration may uniformly keep the in-plane charge transfer characteristics from the photoelectric conversion portion 2 to the floating diffusion 4 and the in-plane saturated charge amount, while improving the brightness shading and the color mixing.

Embodiment 2

Figure 6A:
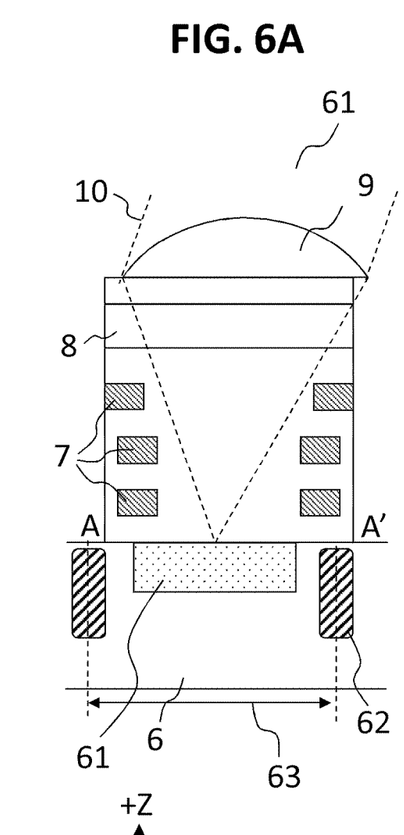
FIGS. 6A to 6C are cross-sectional views of pixels constituting a solid-state imaging device according to embodiment 2.
Figure 6B:
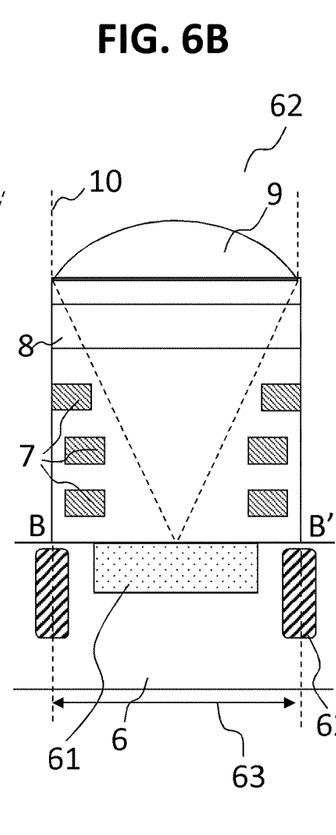
Figure 6C:
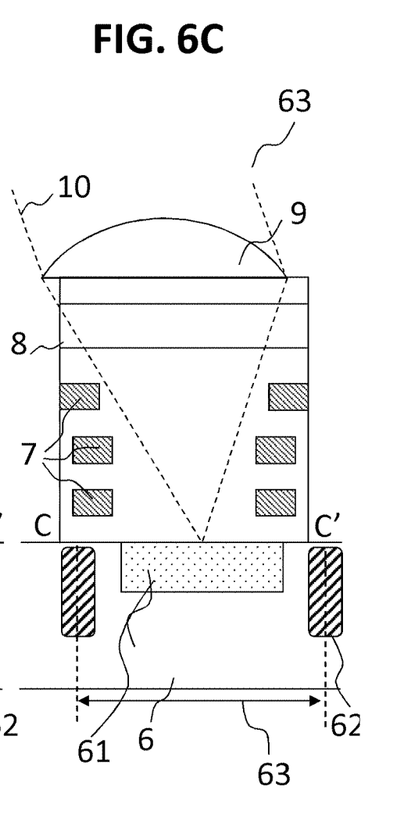

Embodiment 2 will be explained with reference to FIGS. 6A to 6C. FIG. 6A is a cross-sectional view of a pixel in the left side peripheral portion of the pixel area. FIG. 6B is a cross-sectional view of a pixel at the center of the pixel area. FIG. 6C is a cross-sectional view of a pixel in the right side peripheral portion of the pixel area. This embodiment is different from embodiment 1 in that it has a P-type impurity area (pixel separation area) 62 (in the boundary portion) between an N-type impurity area 61 formed in the P well and an N-type impurity area 61 in each of the adjacent pixels, the P-type impurity area 62 having a higher impurity concentration than the P well. In this embodiment, the N-type impurity area 61 and an area 63 defined by the P-type impurity area 62 together function as the photoelectric conversion portion 2. The P-type impurity area 62 has a higher P-type impurity concentration (a first conductivity type impurity concentration) than the P well (a first conductivity type semiconductor area). The P-type impurity area 62 functions as a pixel separation area that defines the pixel.

Thus, the P-type impurity area 62 is also shifted in response to the N-type impurity area 61 in the peripheral portion of the pixel area. Even if the N-type impurity area 61 shifts in the pixel area, the potential distribution near the N-type impurity area 61 will remain unchanged, thus providing no effect on the charge transfer characteristics and the saturated charge amount associated with the photoelectric conversion portion.

The solid-state imaging device in the above configuration may uniformly keep the in-plane charge transfer characteristics from the photoelectric conversion portion to the floating diffusion and the in-plane saturated charge amount, while improving the brightness shading and the color mixing.

Embodiment 3

Figure 7A:
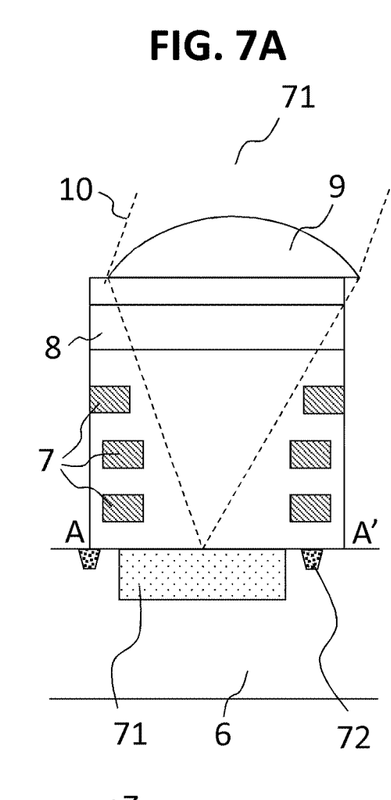
FIGS. 7A to 7C are cross-sectional views of pixels constituting a solid-state imaging device according to embodiment 3.
Figure 7B:
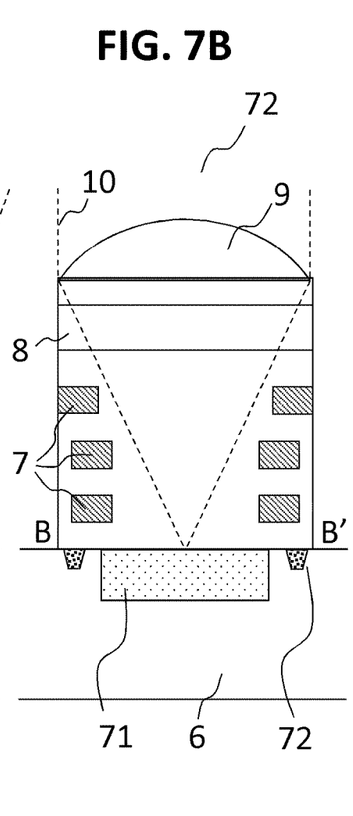
Figure 7C:
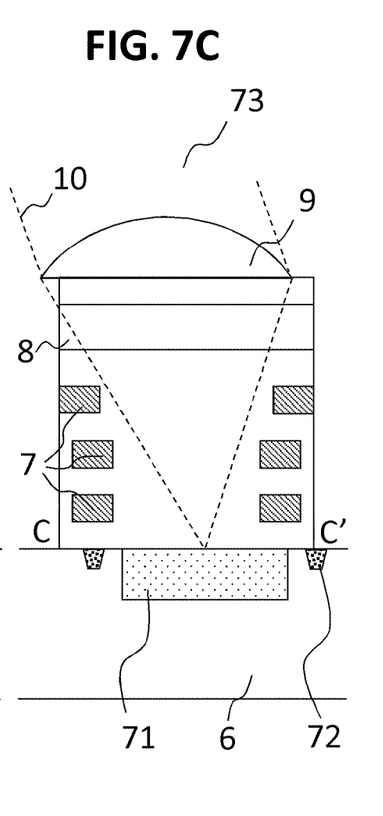

Embodiment 3 will be explained with reference to FIGS. 7A to 7C. FIG. 7A is a cross-sectional view of a pixel in the left side peripheral portion of the pixel area. FIG. 7B is a cross-sectional view of a pixel at the center of the pixel area. FIG. 7C is a cross-sectional view of a pixel in the right side peripheral portion of the pixel area. This embodiment is different from embodiment 1 in that it has an N-type impurity area 71 formed in the P well and an oxide film separation portion (insulating member) 72 disposed surrounding the N-type impurity area 71. In this embodiment, the N-type impurity area 71 and an area defined by the oxide film separation portion 72 together function as the photoelectric conversion portion.

Thus, the oxide film separation portion 72 is also shifted in response to the N-type impurity area 71 in the peripheral portion of the pixel area. Even if the N-type impurity area 71 shifts in the pixel area, the potential distribution near the N-type impurity area 71 will remain unchanged, thus providing no effect on the charge transfer characteristics and the saturated charge amount associated with the photoelectric conversion portion.

The solid-state imaging device in the above configuration may uniformly keep the in-plane charge transfer characteristics from the photoelectric conversion portion to the floating diffusion and the in-plane saturated charge amount, while improving the brightness shading and the color mixing.

Embodiment 4

Figure 8:
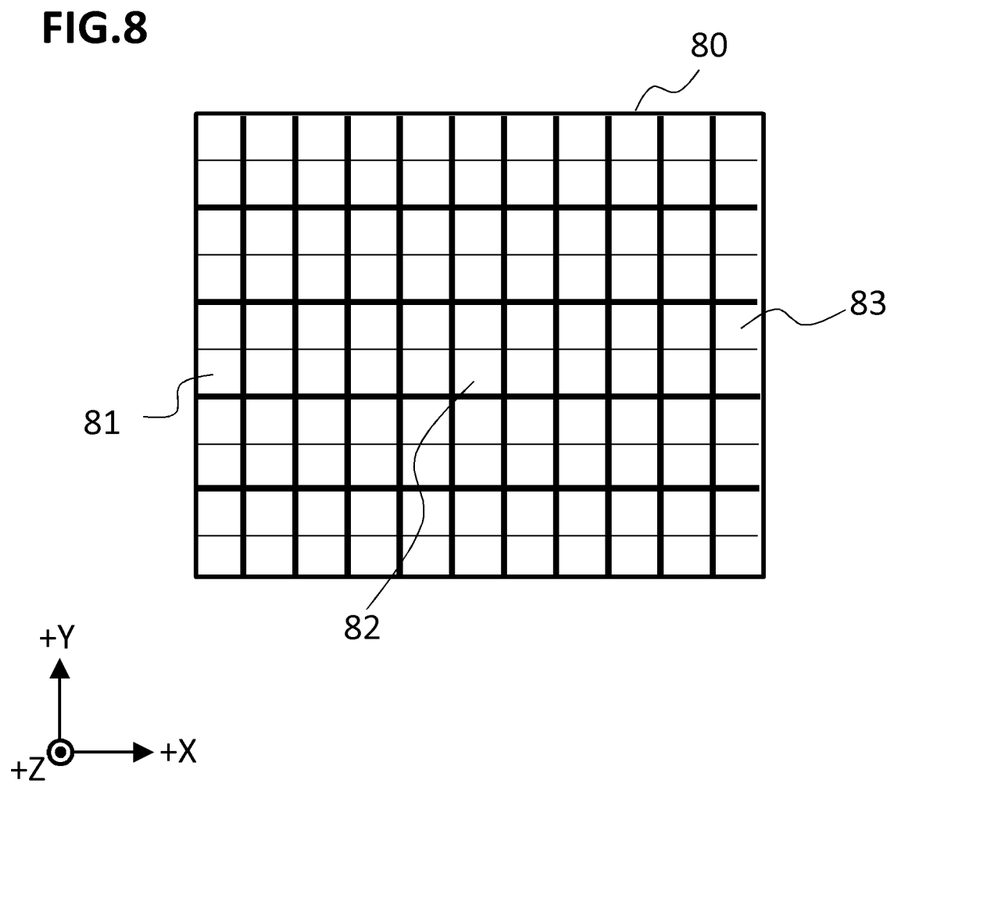
FIG. 8 is a schematic diagram of a pixel area in a solid-state imaging device according to embodiment 4.

In this embodiment, as shown in FIG. 8, a pixel area 80 is formed by arranging a plurality of pixel blocks, each pixel block including pixels in two rows and one column. The pixel block in the central portion of the pixel area 80 is referred to as a pixel block 82. The pixel block in the left side peripheral portion is referred to as a pixel block 81. The pixel block in the right side peripheral portion is referred to as a pixel block 83.

Figure 9A:
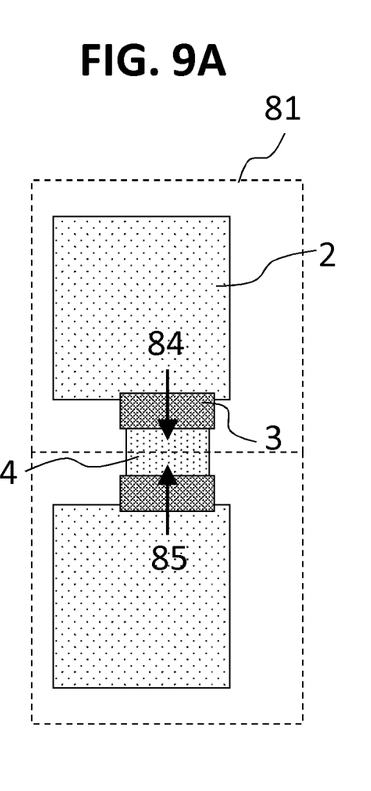
FIGS. 9A to 9C are plan views of pixels included in the solid-state imaging device according to embodiment 4.
Figure 9B:
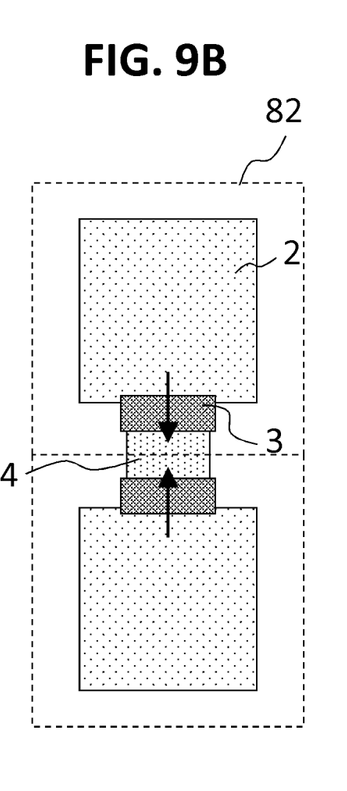
Figure 9C:
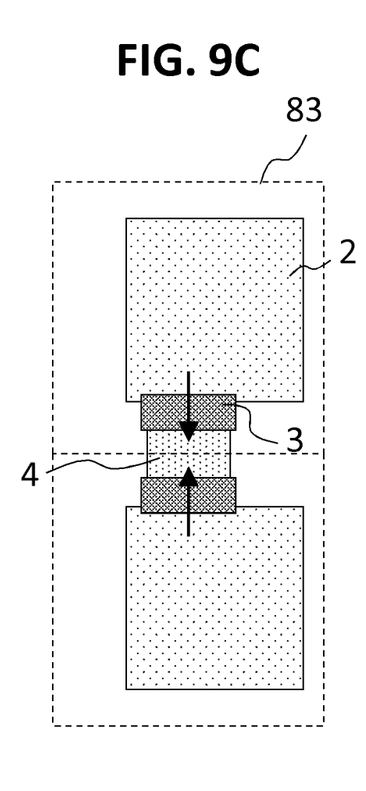

The configuration of each pixel block will be explained with reference to FIGS. 9A to 9C. The basic components of the pixel are the photoelectric conversion portion 2, the transfer gate 3, and the floating diffusion 4 as in embodiment 1. Note, however, that this embodiment provides an axisymmetric configuration about the boundary portion between the upper and lower pixels and the floating diffusion 4 is shared by the upper and lower pixels.

Each of the pixel blocks 81 to 83 includes two pixels adjacent in the Y direction. The charge transfer directions of the two pixels are opposite to each other. Specifically, in each of the pixel blocks 81 to 83, the upper pixel has a charge transfer direction 84 in the −Y direction and the lower pixel has a charge transfer direction 85 in the +Y direction. The charge transfer directions 84 and 85 are opposite to each other, but both are in parallel with the Y-axis direction. Therefore, the directions perpendicular to the charge transfer directions are both X direction. It is thus possible to shift the photoelectric conversion portion 2 in the X direction depending on the distance from the imaging center. The shift direction and the shift amount are the same as those described in embodiment 1 with reference to FIGS. 3 and 4.

The present invention may thus apply to a solid-state imaging device that has a plurality of charge transfer directions in the pixel area as described above if the charge transfer directions are opposite.

The solid-state imaging device in the above configuration may uniformly keep the in-plane charge transfer characteristics from the photoelectric conversion portion to the floating diffusion and the in-plane saturated charge amount, while improving the brightness shading and the color mixing.

Embodiment 5

Figure 10A:
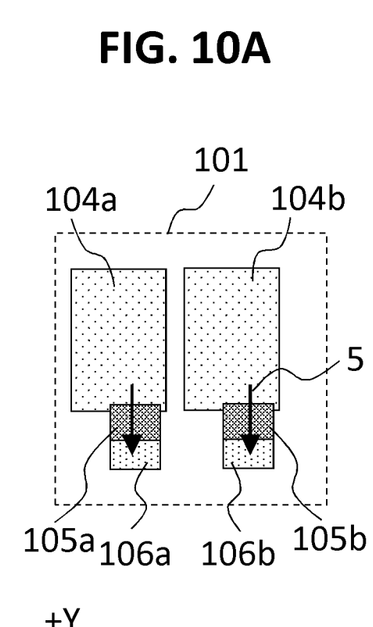
FIGS. 10A to 10C are plan views of pixels included in a solid-state imaging device according to embodiment 5.
Figure 10B:
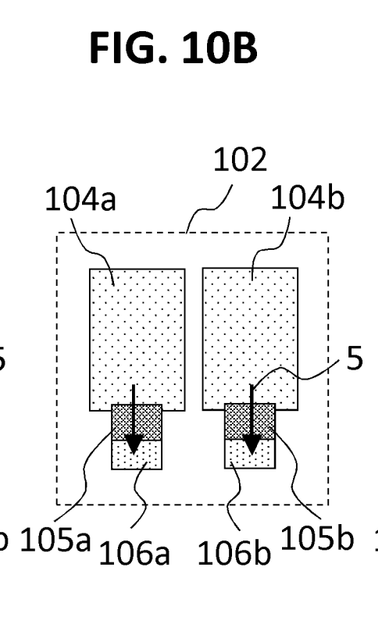
Figure 10C:
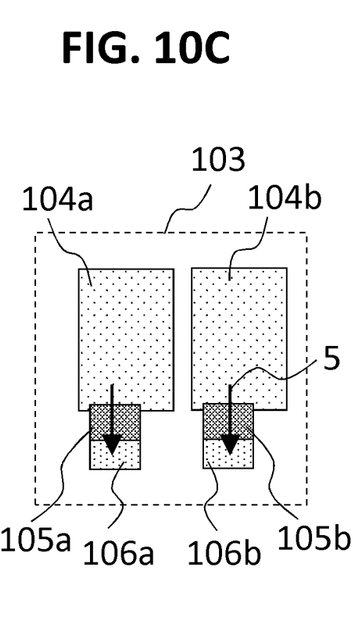

FIGS. 10A to 10C are views showing pixels that may conduct focus detection (distance measurement) and imaging according to the imaging plane phase difference scheme. FIG. 10A shows a pixel in the left side peripheral portion of the pixel area. FIG. 10B shows a pixel at the center of the pixel area. FIG. 10C shows a pixel in the right side peripheral portion of the pixel area. Each pixel includes, in the left side, a photoelectric conversion portion 104a, a transfer transistor 105a, and a floating diffusion 106a. Each pixel also includes, in the right side, a photoelectric conversion portion 104b, a transfer transistor 105b, and a floating diffusion 106b. In other words, each pixel has two light detection portions.

In the pixels in FIGS. 10A and 10C, the photoelectric conversion portions 104a and 104b are shifted relatively to the transfer transistors 105a and 105b, respectively, compared to the pixel in FIG. 10B. Both shift directions are a direction parallel to the X-axis perpendicular to the charge transfer direction 5, and more specifically, they are a direction toward the periphery of the pixel area. Note that it is assumed that the two photoelectric conversion portions 104a and 104b in one pixel have the same shift amount.

The present invention may thus apply to a solid-state image sensor that has a plurality of photoelectric conversion portions, transfer transistors, and floating diffusions in one pixel as described above, because the charge transfer directions 5 are the same in the pixel.

The solid-state imaging device in the above configuration may uniformly keep the in-plane charge transfer characteristics from the photoelectric conversion portion to the floating diffusion and the in-plane saturated charge amount, while improving the brightness shading and the color mixing.

Note that it is not necessary in this embodiment that all pixels are pixels that have a plurality of photoelectric conversion portions that allow for the focus detection, and at least some of the pixels may have a plurality of photoelectric conversion portions. In addition, although an example is taken here where one pixel has two photoelectric conversion portions, one pixel may have three or more photoelectric conversion portions. Further, when one pixel has a plurality of photoelectric conversion portions, the pixel may have only one floating diffusion that is shared by the photoelectric conversion portions.

Embodiment 6

Figure 11:
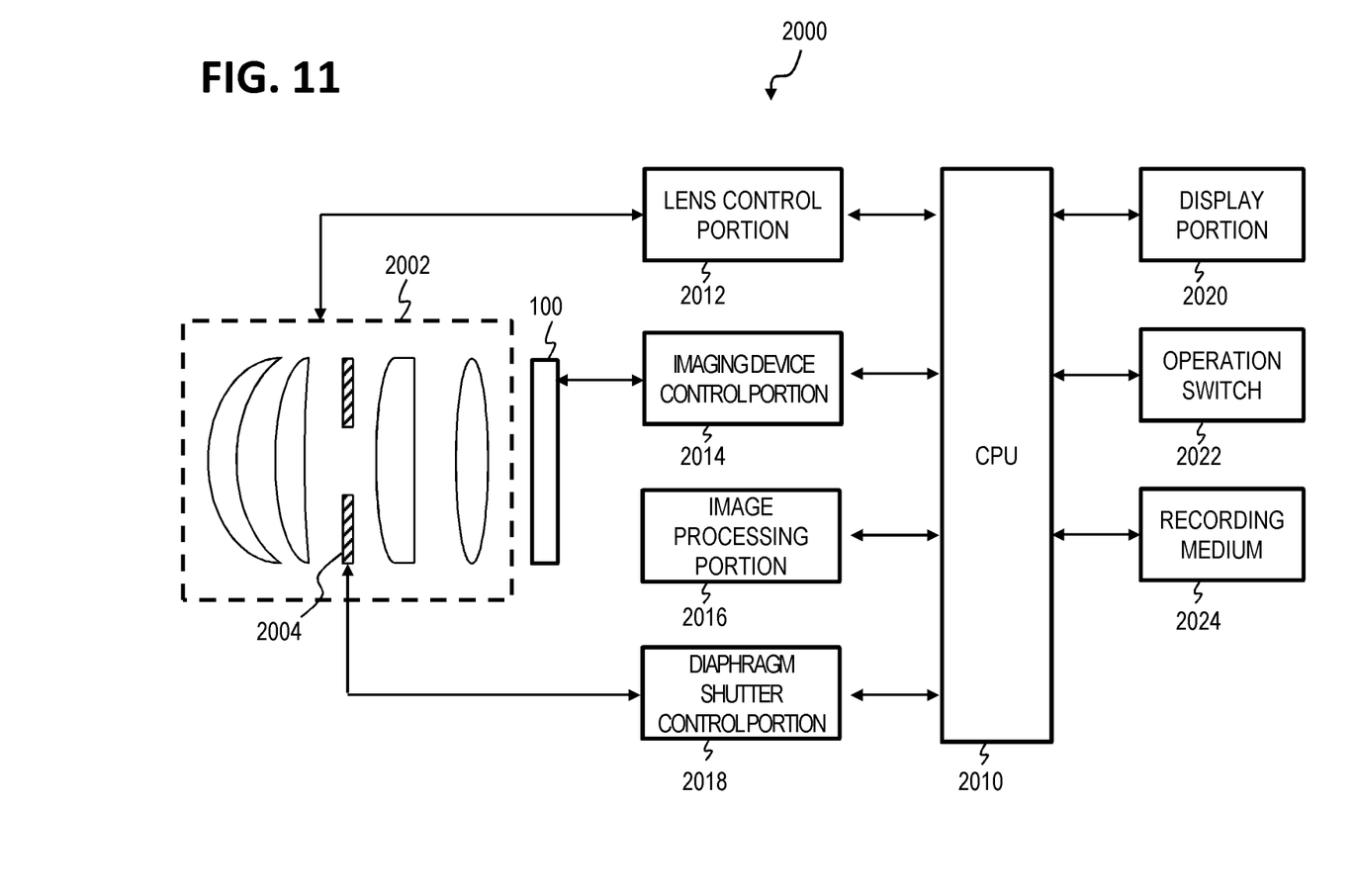
FIG. 11 shows a configuration example of an imaging system according to embodiment 6.

An imaging system according to a sixth embodiment of the present invention will be explained with reference to FIG. 11. FIG. 11 is a block diagram of a schematic configuration of an imaging system according to this embodiment.

The solid-state imaging devices (photoelectric conversion devices) described in the above first to fifth embodiments may apply to various imaging systems. Applicable imaging systems may include, but are not limited to, various types of equipment such as a digital still camera, a digital camcorder, a monitor camera, a copying machine, a facsimile, a mobile phone, an in-vehicle camera, an observation satellite, a medical camera, or the like. The imaging systems may also include a camera module including an optical system such as a lens and a solid-state imaging device (photoelectric conversion device). FIG. 11 is a block diagram of a digital still camera as an example of those imaging systems.

FIG. 11 shows an imaging system 2000, which includes an imaging device 100, an imaging optical system 2002, a CPU 2010, a lens control portion 2012, an imaging device control portion 2014, an image processing portion 2016, and a diaphragm shutter control portion 2018. The imaging system 2000 also includes a display portion 2020, an operation switch 2022, and a recording medium 2024.

The imaging optical system 2002 is an optical system for forming an optical image of the subject, and includes a lens group, a diaphragm 2004, or the like. The diaphragm 2004 has a function of adjusting light intensity during photography by adjusting its opening size. The diaphragm 2004 also functions as an exposure time adjustment shutter during still image photography. The lens group and the diaphragm 2004 are held movable forward and backward in the optical axis direction. These linked operations may provide a scaling function (zoom function) and a focus adjustment function. The imaging optical system 2002 may be integrated into the imaging system or may be an imaging lens mountable to the imaging system.

The imaging device 100 is disposed such that its imaging plane is positioned in the image space of the imaging optical system 2002. The imaging device 100 is one of the solid-state imaging devices (photoelectric conversion devices) explained in the first to fifth embodiments. The imaging device 100 includes a CMOS sensor (pixel portion) and its peripheral circuits (peripheral circuit area). The imaging device 100 includes a plurality of pixels arranged in two dimensions, each pixel including a photoelectric conversion portion. These pixels are provided with color filters to form a two-dimensional single-plate color sensor. The imaging device 100 may photoelectrically convert a subject image imaged by the imaging optical system 2002 for output as an image signal and/or a focus detection signal.

The lens control portion 2012 is to control the forward and backward driving of the lens group in the imaging optical system 2002 to perform scaling operation and focus adjustment. The lens control portion 2012 includes a circuit and/or processing unit configured to achieve those functions. The diaphragm shutter control portion 2018 is to change the opening size of the diaphragm 2004 (for a variable diaphragm value) to adjust light intensity during photography, and is constituted of a circuit and/or processing unit configured to achieve those functions.

The CPU 2010 is a control unit in a camera responsible for various controls of the camera body, and includes an operation portion, a ROM, a RAM, an A/D converter, a D/A converter, a communication interface circuit, or the like. The CPU 2010 controls the operation of each portion in the camera according to a computer program stored in a ROM or the like. The CPU 2010 performs a series of photography operations such as AF, imaging, image processing, and recording, including detection of the focus state (focus detection) of the imaging optical system 2002. The CPU 2010 also serves as a signal processing portion.

The imaging device control portion 2014 is to control the operation of the imaging device 100 and to A/D convert a signal output from the imaging device 100 and transmit the result to the CPU 2010, and includes a circuit and/or control unit configured to achieve those functions. The imaging device 100 may have the A/D conversion function. The image processing portion 2016 is a processing unit that subjects the A/D converted signal to processing such as y conversion and color interpolation to generate an image signal. The image processing portion 2016 includes a circuit and/or control unit configured to achieve those functions. The display portion 2020 is a display device such as a liquid crystal display device (LCD), and displays information related to a photography mode of the camera, a preview image before photography, a check image after photography, the focused state at the focus detection, or the like. The operation switch 2022 includes a power supply switch, a release (photography trigger) switch, a zoom operation switch, a photography mode selection switch, or the like. The recording medium 2024 is to record a photographed image or the like, and may be built in the imaging system or removable such as a memory card.

In this way, the imaging system 2000 applied with the imaging device 100 according to the first to fifth embodiments may provide a high performance imaging system.

Embodiment 7

Figure 12A:
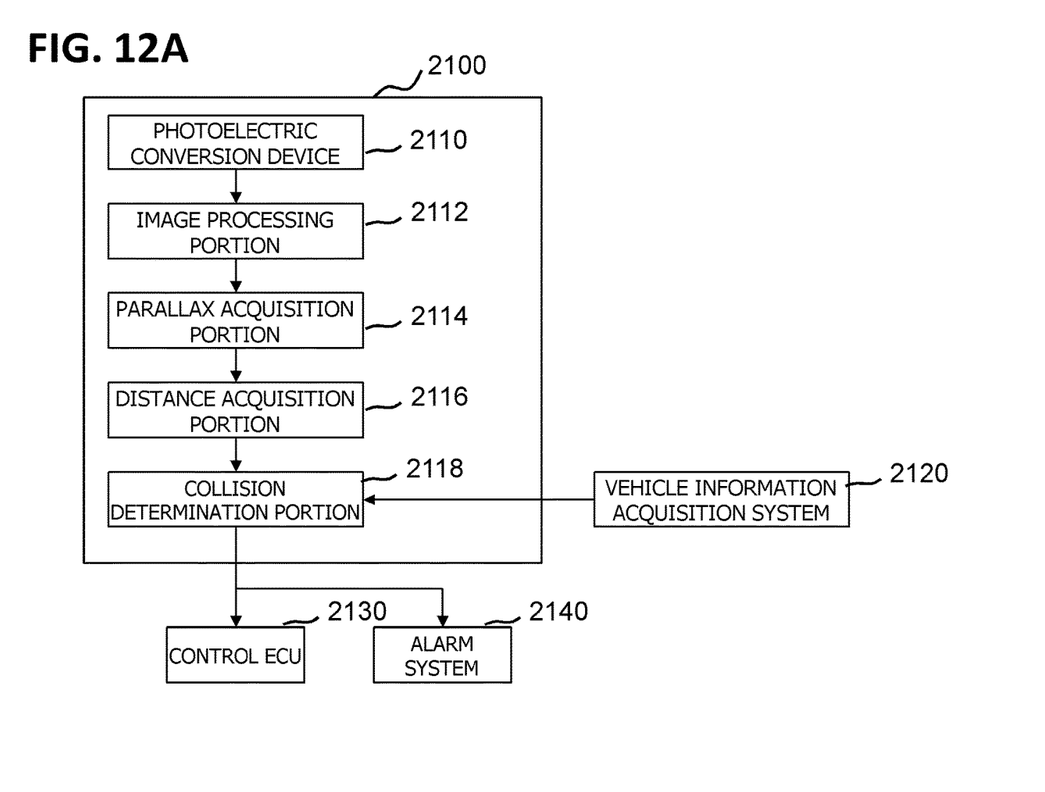
FIGS. 12A to 12B are views showing example configurations of an imaging system and a mobile object, respectively, according to embodiment 7.
Figure 12B:
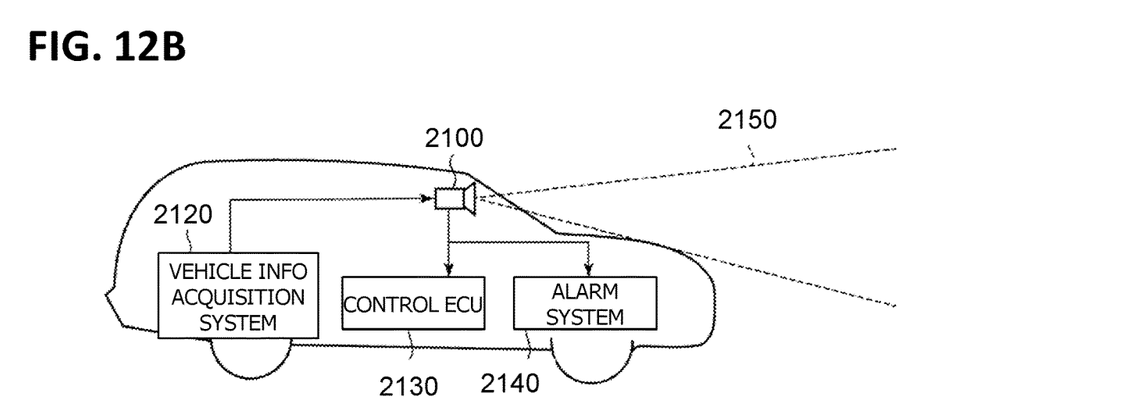

An imaging system and a mobile object according to a seventh embodiment of the present invention will be explained with reference to FIGS. 12A and 12B. FIGS. 12A and 12B show configurations of the imaging system and mobile object according to this embodiment.

FIG. 12A shows an example of an imaging system 2100 associated with an in-vehicle camera. The imaging system 2100 has a photoelectric conversion device 2110. The photoelectric conversion device 2110 is any one of the solid-state imaging devices (photoelectric conversion devices) according to the above first to sixth embodiments. The imaging system 2100 has an image processing portion 2112 and a parallax acquisition portion 2114. The image processing portion 2112 is a processing unit that subjects a plurality of sets of image data acquired by the photoelectric conversion device 2110 to image processing. The parallax acquisition portion 2114 is a processing unit that calculates parallax (a phase difference of a parallax image) from the sets of image data acquired by the photoelectric conversion device 2110. The imaging system 2100 also includes a distance acquisition portion 2116, which is a processing unit that calculates the distance to the subject based on the calculated parallax. The imaging system 2100 also includes a collision determination portion 2118, which is a processing unit that determines a possibility of collision based on the calculated distance. Here, the parallax acquisition portion 2114 and the distance acquisition portion 2116 are examples of information acquiring means that acquires information such as distance information to the subject. In other words, the distance information is information related to parallax, defocus amount, the distance to the subject, or the like. The collision determination portion 2118 may determine a possibility of collision using any of the distance information. The above processing unit may be provided by specially designed hardware or may be provided by general hardware that performs operation based on a software module. In addition, the processing unit may be provided by a Field Programmable Gate Array (FPGA), an Application Specific Integrated Circuit (ASIC), or the like or may be provided by a combination thereof.

The imaging system 2100 is connected to a vehicle information acquisition system 2120, and may thus acquire vehicle information including a vehicle speed, a yaw rate, and a rudder angle. The imaging system 2100 also has a control ECU 2130 connected thereto. The control ECU 2130 is a control unit that outputs a control signal for generating a braking force to the vehicle based on the determination by the collision determination portion 2118. In other words, the control ECU 2130 is an example of a mobile object control means that controls a mobile object based on the distance information. The imaging system 2100 is also connected to an alarm system 2140. The alarm system 2140 gives an alarm to the driver based on the determination by the collision determination portion 2118. For example, if the collision determination portion 2118 determines a high possibility of collision, the control ECU 2130 performs a vehicle control that avoids collision and reduces damage by braking, releasing the accelerator, limiting the engine output, or the like. The alarm system 2140 warns the user by sounding an alarm such as sound, displaying alarm information on a screen of a car navigation system or the like, giving vibration to a seatbelt and steering, or the like.

In this embodiment, the surroundings of the vehicle such as front or rear are imaged by the imaging system 2100. FIG. 12B shows the imaging system 2100 when imaging the front of the vehicle (imaging range 2150). The vehicle information acquisition system 2120 directs the imaging system 2100 to operate and perform imaging. Using the imaging devices according to the above first to sixth embodiments as the photoelectric conversion device 2110, the imaging system 2100 in this embodiment may provide more improved ranging accuracy.

Although the above description shows an example control that prevents collision with other vehicles, the present invention may also apply to a control of autonomous driving following other vehicles, a control of autonomous driving preventing running over a traffic lane, or the like. In addition to a vehicle such as a car, the imaging system may also apply to, for example, a mobile object (transportation equipment) such as a vessel, an aircraft, or an industrial robot. The moving device in the mobile object (transportation equipment) is one of various types of drive sources, including an engine, a motor, a wheel, and a propeller. In addition to a mobile object, the imaging system may also apply to equipment, such as Intelligent Transport Systems (ITS), that commonly uses the object recognition.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-1145, filed on Jan. 8, 2019, which is hereby incorporated by reference herein in its entirety.

What is claimed is:

1. A photoelectric conversion device comprising:
a pixel area including a plurality of pixels arranged in a matrix, wherein the plurality of pixels includes a first pixel and a second pixel,
wherein each of the first pixel and the second pixel comprises (1) a photoelectric conversion portion, (2) a floating diffusion, and (3) a transfer gate, the transfer gate controlling transfer of charges generated in the photoelectric conversion portion to the floating diffusion,
wherein the photoelectric conversion portion of the first pixel has a same area as the photoelectric conversion portion of the second pixel,
wherein the photoelectric conversion portion of the first pixel is shifted relatively to the transfer gate depending on a position thereof in the pixel area,
wherein a shifting direction is a direction perpendicular to a charge transfer direction from the photoelectric conversion portion to the floating diffusion, and
wherein a first distance along the shifting direction from a first end of the photoelectric conversion portion to a first end of the transfer gate is longer than a second distance along the shifting direction from a second end of the photoelectric conversion portion facing the first end of the photoelectric conversion portion to a second end of the transfer gate facing the first end of the transfer gate.

2. The photoelectric conversion device according to claim 1, wherein the photoelectric conversion portion is a second semiconductor area of a second conductivity type formed in a first semiconductor area of a first conductivity type, the second conductivity type being opposite in polarity to the first conductivity type.

3. The photoelectric conversion device according to claim 1, wherein the photoelectric conversion portion comprises:
a second semiconductor area of a second conductivity type formed in a first semiconductor area of a first conductivity type, the second conductivity type being opposite in polarity to the first conductivity type; and
an area defined by a pixel separation area in a boundary portion with an adjacent pixel, the pixel separation area having a higher first conductivity type impurity concentration than the first semiconductor area.

4. The photoelectric conversion device according to claim 1, wherein the photoelectric conversion portion comprises:
a second semiconductor area of a second conductivity type formed in a first semiconductor area of a first conductivity type, the second conductivity type being opposite in polarity to the first conductivity type; and
an area defined by an insulating member provided surrounding the second semiconductor area.

5. The photoelectric conversion device according to claim 1, wherein a transistor is not disposed between photoelectric conversion portions in pixels adjacent in a direction perpendicular to the charge transfer direction.

6. The photoelectric conversion device according to claim 1, wherein in a cross-section through a center of the photoelectric conversion portion in a direction perpendicular to the charge transfer direction, the photoelectric conversion portion is uniform in shape among all pixels in the pixel area.

7. The photoelectric conversion device according to claim 1, wherein a shift amount of the photoelectric conversion portion is larger as away from a central column in the pixel area.

8. The photoelectric conversion device according to claim 5, wherein a shift amount of the photoelectric conversion portion is larger as away from a central column in the pixel area.

9. The photoelectric conversion device according to claim 1, wherein a long side direction of the pixel area is a shift direction of the photoelectric conversion portion and a short side direction of the pixel area is the charge transfer direction.

10. The photoelectric conversion device according to claim 7, wherein a long side direction of the pixel area is a shift direction of the photoelectric conversion portion and a short side direction of the pixel area is the charge transfer direction.

11. The photoelectric conversion device according to claim 8, wherein a long side direction of the pixel area is a shift direction of the photoelectric conversion portion and a short side direction of the pixel area is the charge transfer direction.

12. The photoelectric conversion device according to claim 1, wherein the charge transfer direction is a same direction among all pixels in the pixel area.

13. The photoelectric conversion device according to claim 1, wherein the charge transfer direction is either a first direction or a second direction, the second direction being opposite to the first direction, and wherein the charge transfer directions of pixels adjacent in the first direction are opposite to each other.

14. The photoelectric conversion device according to claim 1, wherein at least some of pixels in the pixel area have a plurality of photoelectric conversion portions and the photoelectric conversion portions have a same charge transfer direction.

15. The photoelectric conversion device according to claim 1, wherein a relative positional relationship between the photoelectric conversion portion and the transfer gate in the charge transfer direction is same among all pixels in the pixel area.

16. The photoelectric conversion device according to claim 1, wherein a microlens having a light collection function is arranged over the photoelectric conversion portion in each pixel, and wherein the microlens is shifted in a radial direction toward the center of the pixel area depending on a distance from the center of the pixel area.

17. The photoelectric conversion device according to claim 7, wherein a microlens having a light collection function is arranged over the photoelectric conversion portion in each pixel, and wherein the microlens is shifted in a radial direction toward the center of the pixel area depending on a distance from the center of the pixel area.

18. An imaging system comprising:

the photoelectric conversion device according to claim 1; and a signal processing portion processing a signal output from the photoelectric conversion device.

19. A mobile object comprising:

the photoelectric conversion device according to claim 1;

a moving device;

circuitry and/or at least one processor, the circuitry and/or at least one processor being configured to function as a plurality of units comprising: (1) a processing unit that acquires information from a signal output from the photoelectric conversion device; and (2 a control unit that controls the moving device based on the information.

20. The photoelectric conversion device to claim 1, wherein each of the plurality of pixels comprises a photoelectric conversion portion having a same area.

21. The photoelectric conversion apparatus according to claim 1, wherein the shifting direction is a direction from the first end of the photoelectric conversion unit toward the second end of the photoelectric conversion unit.

* * * * *